United States Patent [19]
Perdue

[11] Patent Number: 5,563,768
[45] Date of Patent: Oct. 8, 1996

[54] HEAT SOURCE COOLING APPARATUS AND METHOD UTILIZING MECHANISM FOR DIVIDING A FLOW OF COOLING FLUID

[75] Inventor: David W. Perdue, Anderson, S.C.

[73] Assignee: AT&T Global Information Solutions Company, Dayton, Ohio

[21] Appl. No.: 524,020

[22] Filed: Aug. 31, 1995

[51] Int. Cl.⁶ .................................................. H05K 7/20
[52] U.S. Cl. ..................... 361/695; 165/80.3; 257/722
[58] Field of Search .................... 165/80.3, 80.4; 62/259.2; 257/714, 721, 722; 361/688–699, 702, 703, 724

[56] References Cited

U.S. PATENT DOCUMENTS

| | | | |
|---|---|---|---|
| 4,399,484 | 8/1983 | Mayer | 361/382 |
| 4,648,007 | 3/1987 | Garner | 361/690 |
| 4,750,086 | 6/1988 | Mittal | 361/382 |
| 4,783,721 | 11/1988 | Yamamoto et al. | 361/382 |
| 4,882,654 | 11/1989 | Nelson et al. | 361/382 |
| 4,897,762 | 1/1990 | Daikoku et al. | 361/382 |
| 5,005,640 | 4/1991 | Lapinski et al. | 165/170 |
| 5,077,601 | 12/1991 | Hatada et al. | 361/697 |
| 5,103,374 | 4/1992 | Azar | 361/382 |
| 5,239,200 | 8/1993 | Messina et al. | 257/714 |
| 5,239,443 | 8/1993 | Fahey et al. | 361/689 |
| 5,264,984 | 11/1993 | Akamatsu | 361/689 |
| 5,265,670 | 11/1993 | Zingher | 165/80.4 |
| 5,270,572 | 12/1993 | Nakajima et al. | 257/714 |
| 5,294,830 | 3/1994 | Young et al. | 257/714 |
| 5,491,610 | 2/1996 | Mok et al. | 361/695 |

FOREIGN PATENT DOCUMENTS 0268817  6/1989  Germany ............................... 361/694

Primary Examiner—Gregory D. Thompson
Attorney, Agent, or Firm—Paul J. Maginot

[57] ABSTRACT

A method of cooling a heat source includes the steps of (1) positioning a thermally conductive base in contact with the heat source, the base having a plurality of fins which define a plurality of channels, (2) generating an initial flow of fluid, (3) positioning a baffle in the path of the initial flow of fluid so as to create a primary flow of fluid and a secondary flow of fluid, (4) directing the primary flow of fluid against the plurality of fins so as to form a quantity of spent fluid which is advanced into the channels, (5) directing the secondary flow of fluid into the plurality of channels so as to force the quantity of spent fluid out of the plurality of channels, and (6) repositioning the baffle from a first position to a second position to change the magnitude of the primary flow of fluid. An apparatus for cooling a heat source which splits an initial flow of fluid into a primary flow of fluid and a secondary flow of fluid is also disclosed.

13 Claims, 5 Drawing Sheets

HEAT SOURCE COOLING APPARATUS AND METHOD UTILIZING MECHANISM FOR DIVIDING A FLOW OF COOLING FLUID

CROSS REFERENCE

Cross reference is made to co-pending U.S. patent application Ser. No. 08/524,022, entitled "Method and Apparatus for Cooling a Heat Source", invented by Bishop et al. which is assigned to the same assignee as the present invention, and filed concurrently herewith.

BACKGROUND OF THE INVENTION

The present invention generally relates to a heat source cooling apparatus and method, and more particularly a heat source cooling apparatus and method which utilizes a mechanism to divide a flow of cooling fluid.

The temperature of an integrated circuit device must be maintained within a certain temperature range to ensure proper function, reliability and useful life. As a result, a variety of devices have been designed to cool integrated circuit devices.

For example, one technique for cooling integrated circuit devices is disclosed in U.S. Pat. No. 5,294,830 which describes a thermal conduction module comprising a chip-carrying surface and at least one integrated circuit chip on the substrate. A deformable, liquid-impermeable, thermally conductive film or foil extends over an upper surface of the chip. A piston has a lower surface which urges and conforms the film against the chip upper surface and contains at least one open channel permitting coolant passage and contact with the film without direct contact between the coolant and the chip.

Another example is U.S. Pat. No. 5,264,984 which describes a system for cooling electronic circuit components mounted on a substrate. The system includes containers placed on the respective components, and nozzles each having a central through-hole and peripheral through-holes. The outer bottom surface of each container is in thermal contact with a corresponding electronic circuit component. Liquid coolant is supplied into each container via the central through-hole, and discharged through the peripheral through-holes to a location outside the container.

Another example is U.S. Pat. No. 5,239,443 which describes a blind hole cold plate cooling system having a fluid inlet manifold with at least one jet nozzle and a heat transfer plate with a first and second surface. The first surface has a complimentary cavity for receiving the jet nozzle. The second surface is planar for contact with at least one heat generating device. The cooling system also has an annular gap defined by the center periphery of the jet nozzle and the surface of the complementary cavity.

U.S. Pat. 5,239,200 discloses an apparatus including a thermally conductive cooling plate which has a plurality of integral closed end channels. A cover adapted to seal the periphery of the cooling member is provided and is spaced from the channel-containing surface. The cover has a plurality of integral baffles extending toward the cooling member into and along the length of the channels. The baffles and channels are spaced from each other to permit passage of a coolant in a flow direction normal to the channels. An inlet and outlet for coolant are provided on opposite ends of the apparatus.

U.S. Pat. No. 5,005,640 teaches a cooler having a plurality of first passages in fluid communication with a plurality of second passages. A coolant flows through the second passages and then through the first passages which are in close proximity to a heating source. The first and second passages are oriented and connected such that the direction of coolant flow in the first passages is opposite to the direction of flow in the second passages.

U.S. Pat. No. 4,897,762 discloses a cooling system in which a fluid is sprayed against the cooling surface of an electronic circuit device to cool the device and air is supplied in the opposite direction to the flow of the fluid to form an air curtain, thereby preventing the fluid from depositing on the electric circuitry of the devices.

U.S. Pat. No. 4,750,086 teaches an apparatus including a heat spreader having a planar surface urged against a planar surface of a chip by flexible microbellows. The surface area of the heat spreader is greater than the mating surface area of the chip. The heat spreader is attached to the bottom surface of the microbellows. The surface area of the heat spreader which mates with the surface of the chip is highly polished and coated with a highly conductive soft metal. A jet of coolant is forced into the inner surface of the microbellows.

Some of the aforementioned designs of cooling devices for integrated circuits are mechanically complex and would be relatively expensive to implement. Others designs would consume a relatively large amount of space which is a critical parameter in many electronic component environments.

It would be desirable to provide an apparatus and method for cooling a heat source such as an integrated circuit device which is relatively inexpensive to implement and would not consume a relatively large amount of space in an electronic component environment. It would also be desirable to provide an apparatus and method for cooling a heat source such as an integrated circuit device which provides enhanced cooling of the heat source.

SUMMARY OF THE INVENTION

In accordance with one embodiment of the present invention, there is provided a method of cooling a heat source. The method includes the steps of (1) positioning a thermally conductive base having a plurality of channels defined therein in contact with the heat source, (2) generating an initial flow of fluid, (3) positioning a baffle in the path of the initial flow of fluid so as to create a primary flow of fluid and a secondary flow of fluid, (4) directing the primary flow of fluid so as to contact the base, and (5) directing the secondary flow of fluid into the channels.

Pursuant to another embodiment of the present invention, there is provided an apparatus for cooling a heat source. The apparatus includes a fan for generating an initial flow of fluid. The apparatus further includes a thermally conductive base having a plurality of channels defined therein, said base being positioned in contact with said heat source. Additionally, the apparatus includes a baffle positioned in the initial flow of fluid so as to create a primary flow of fluid and a secondary flow of fluid, wherein the primary flow of fluid is directed onto said base, and the secondary flow of fluid is directed into the plurality of channels.

Pursuant to yet another embodiment of the present invention, there is provided a method of cooling an integrated circuit device. The method includes the steps of (1) positioning a thermally conductive base in contact with the integrated circuit device, the base having a plurality of fins which define a plurality of channels, (2) generating an initial flow of fluid, (3) positioning a baffle in the path of the initial flow of fluid so as to create a primary flow of fluid and a secondary flow of fluid, (4) directing the primary flow of fluid against the plurality of fins so as to form a quantity of spent fluid which is advanced into the channels, and (5) directing the secondary flow of fluid into the plurality of channels so as to force the quantity of spent fluid out of the plurality of channels.

According to still another embodiment of the present invention, there is provided a method of cooling a heat source. The method includes the steps of (1) positioning a thermally conductive base having a plurality of channels defined therein in contact with the heat source, (2) generating an initial flow of fluid, (3) positioning a baffle at a first position in the path of the initial flow of fluid so as create a primary flow of fluid and a secondary flow of fluid, (4) directing the primary flow of fluid so as to contact the base, (5) directing the secondary flow of fluid into the plurality of channels, and (6) moving the baffle to a second position in the path of the initial flow of fluid so as to change the magnitude of the primary flow of fluid.

It is therefore an object of the present invention to provide an improved apparatus and method for cooling a heat source.

It is another object of the present invention to provide a new and useful apparatus and method for cooling a heat source.

It is yet another object of the present invention to provide an apparatus and method for cooling a heat source such as an integrated circuit device which is relatively inexpensive to implement.

It is still another object of the present invention to provide an apparatus and method for cooling a heat source such as an integrated circuit device which would not consume a relatively large amount of space in an electronic component environment.

It is yet another object of the present invention to provide an apparatus and method for cooling a heat source such as an integrated circuit device which provides for enhanced cooling of the heat source.

The above and other objects, features, and advantages of the present invention will become apparent from the following description and attached drawings.

DETAILED DESCRIPTION OF THE PREFERRED EMBODIMENT

Figure 1:
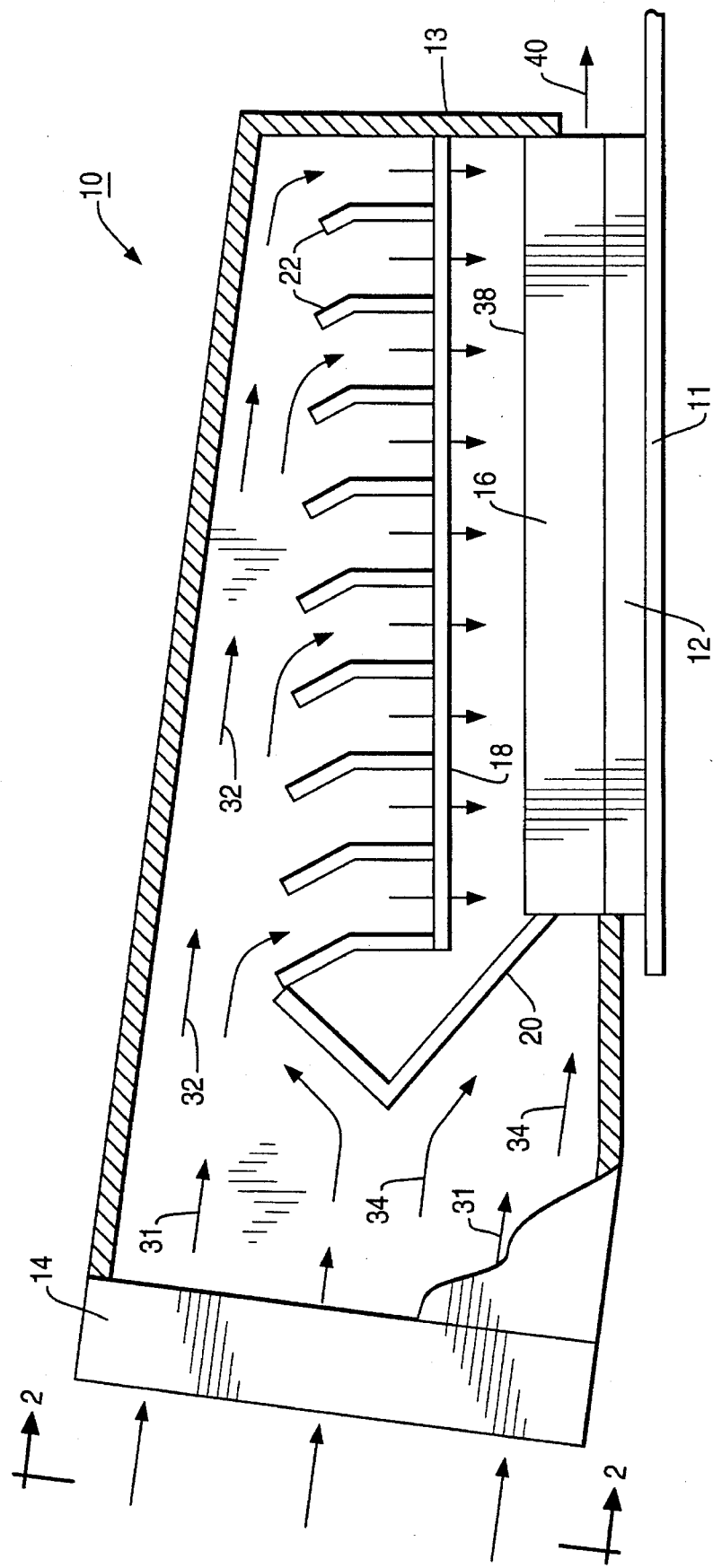
FIG. 1 is a partial cross-sectional view of a first embodiment of a cooling apparatus which incorporates the features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 2:
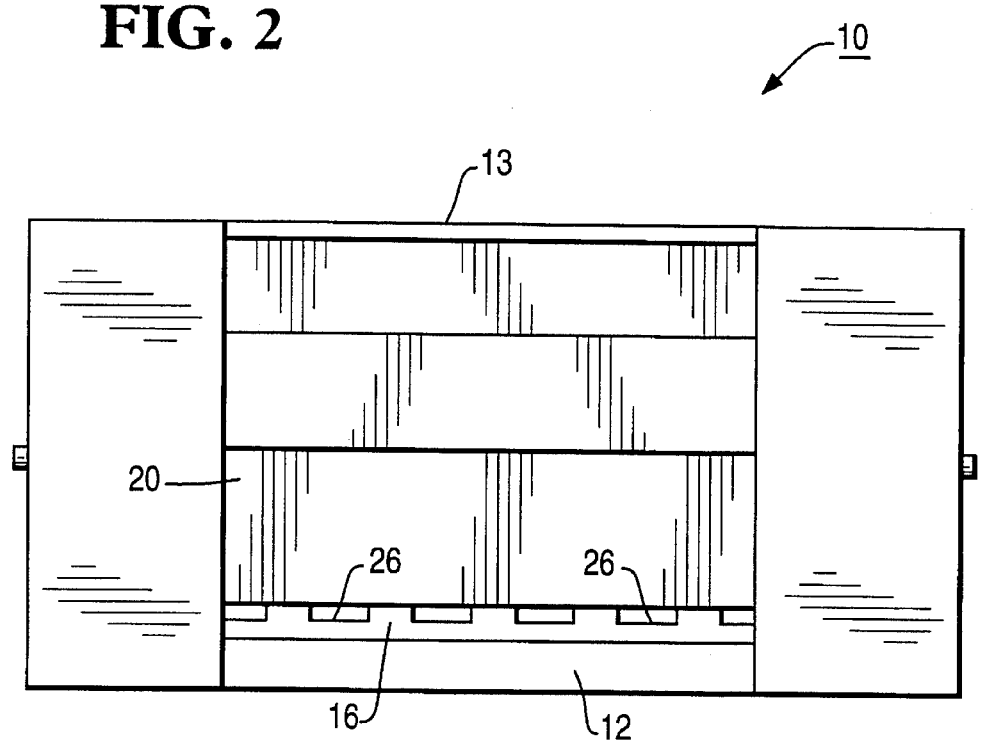
FIG. 2 is an enlarged front elevational view of the cooling apparatus taken along the line 2—2 of FIG. 1.

Referring now to FIGS. 1–2, there is shown a first embodiment of a cooling apparatus 10. The cooling apparatus 10 is adapted to cool a heat source 12, such as an integrated circuit device which is mounted on a printed circuit board 11.

The cooling apparatus 10 includes housing 13 and a fan 14. The fan 14 is positioned at one end of the housing 13. The fan 14 is not shown in FIG. 2 for clarity of description. The cooling apparatus 10 further includes a base 16, a plate 18 and a stationary baffle 20. The base 16 is shown in more detail in FIGS. 3 and 4, while the plate 18 is shown in more detail in FIGS. 5 and 6. The base 16 is positioned in contact with the heat source 12. The plate 18 is positioned over the base 16. The cooling apparatus 10 further includes a plurality of plate baffles 22 which are secured in contact with the plate 18 as shown in FIG. 1.

Figure 3:
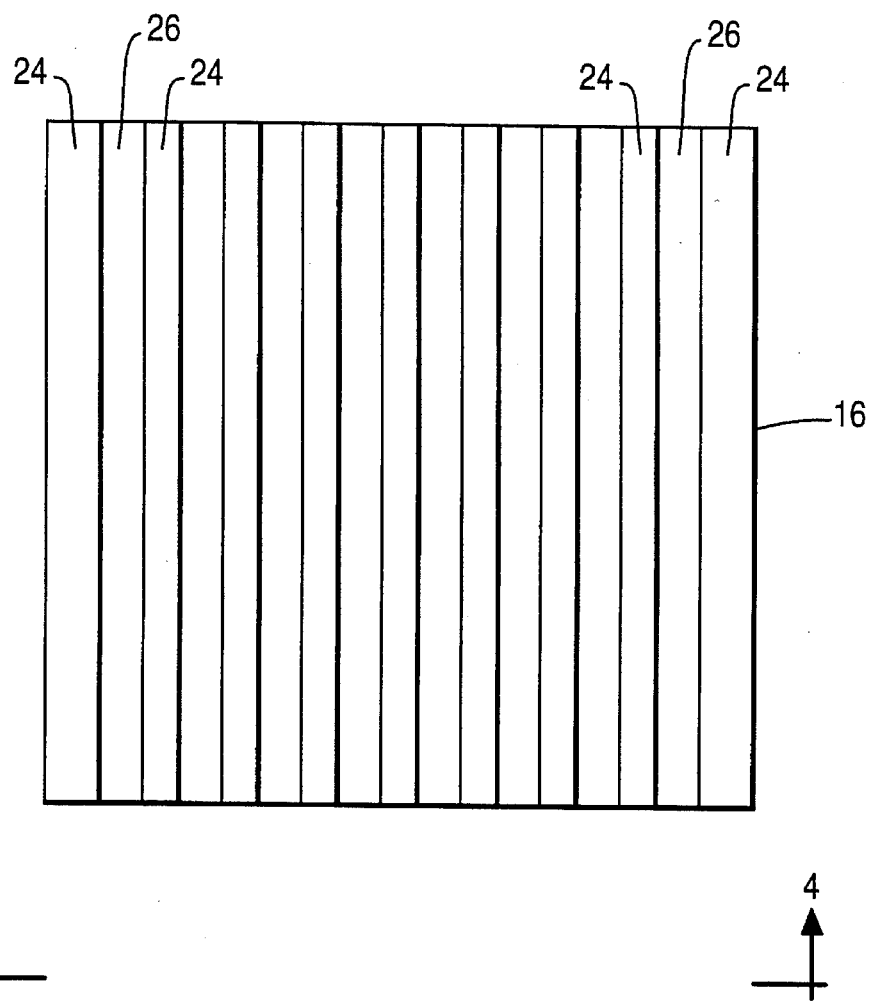
FIG. 3 is a top elevational view of a base of the cooling apparatus of FIG. 1.
Figure 4:
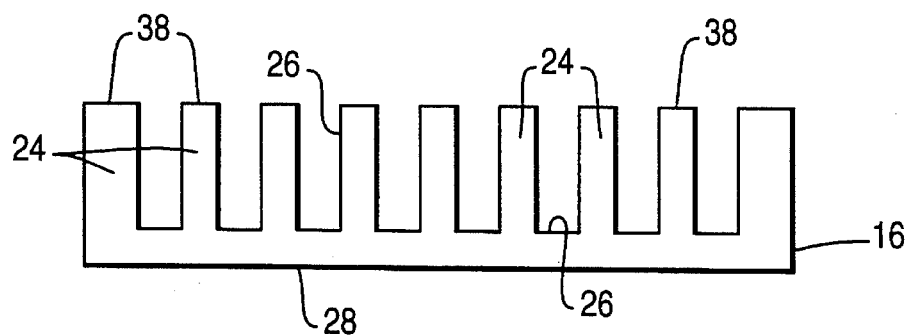
FIG. 4 is a side elevational view of the base taken along the line 4—4 of FIG. 3.
Figure 8:
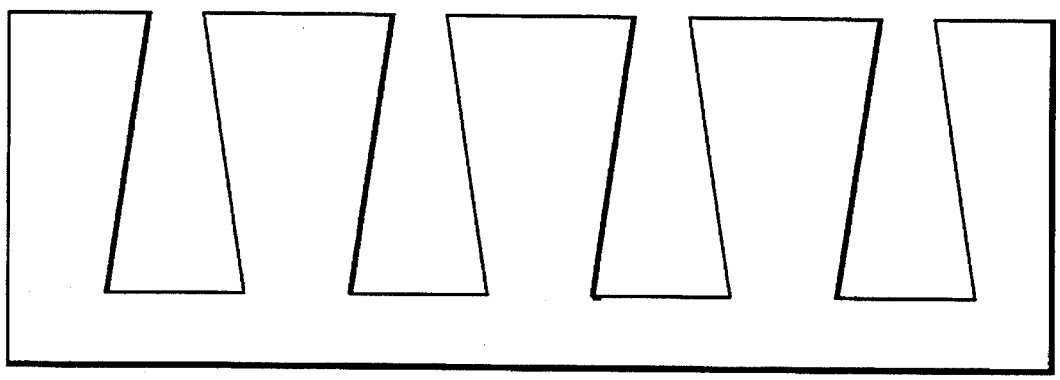
FIG. 8 shows a base having fins which are shaped in an increasingly tapered manner which is a first alternative to the base shown in FIG. 4.
Figure 9:
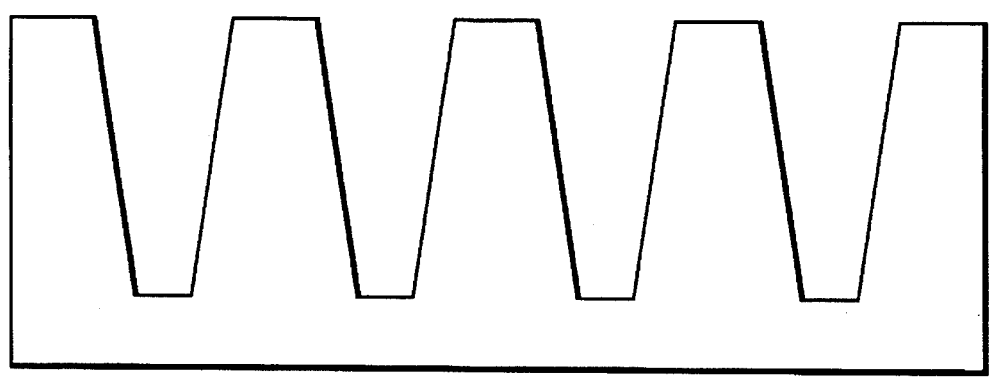
FIG. 9 shows a base having fins which are shaped in a decreasingly tapered manner which is a second alternative to the base shown in FIG. 4.

The base 16 is made of a metal such as aluminum. The base 16 includes a plurality of rectangularly-shaped fins 24 which are oriented in parallel with one another as shown in FIGS. 3 and 4. Alternatively, the fins may be shaped in an increasingly tapered manner as shown in FIG. 8 or a decreasingly tapered manner as shown in FIG. 9. Defined between each pair of adjacent fins 24 is a channel 26. On the side of the base opposite the fins 24 is a mating surface 28. The mating surface 28 is adapted to be positioned in contact with the heat source 12 as shown in FIG. 1.

Figure 5:
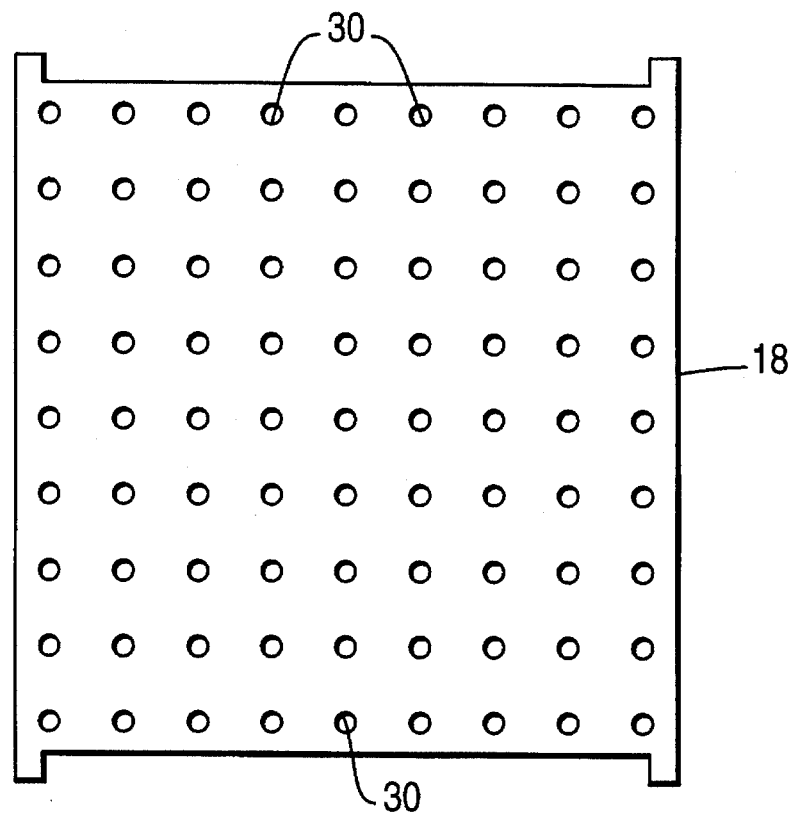
FIG. 5 is a top elevational view of a plate of the cooling apparatus of FIG. 1.
Figure 6:
FIG. 6 is a side elevational view of the plate taken along the line 6—6 of FIG. 5.

The plate 18 is made of a rigid plastics material and has a plurality of openings 30 defined therein as shown in FIG. 5. The openings 30 are circular and are adapted to allow a fluid, such as air, to be advanced therethrough.

During operation of the cooling apparatus 10, the fan 14 generates an initial flow of fluid, indicated by arrows 31, such as air. Thereafter, the initial flow of fluid 31 contacts the stationary baffle 20 thereby splitting it into a primary flow of fluid and a secondary flow of fluid. The primary flow of fluid is indicated by arrows 32, while the secondary flow of fluid is indicated by the arrows 34.

Thereafter, the primary flow of fluid 32 advances within the housing 13 and is itself split by the plurality of plate baffles 22. The plate baffles direct the primary flow of fluid 32 so that it advances through the openings 30 of the plate 18. After advancing through the openings 30, the primary flow of air 32 impinges upon a top surface 38 of the fins 24. It should be noted that when the primary flow of fluid 32 contacts the top surface 38 of the fins 24, spent or heated fluid is formed which continues to advance into the channels 26 of the base 16.

Concurrently with the advancement of the primary flow of fluid 32, the secondary flow of fluid 34 advances within the housing 13 and is guided to advance into the channels 26 of the base 16. As the secondary flow of fluid 34 advances through the channels 26, the spent fluid becomes entrained in the secondary flow of fluid 34. The spent fluid along with the secondary flow of fluid is exhausted out of the channels 26 as an exhausted flow of fluid 40 as shown in FIG. 1. With the spent fluid removed from the channels 26, it is prevented from recirculating in the physical space which is located adjacent to the base 16.

Figure 7:
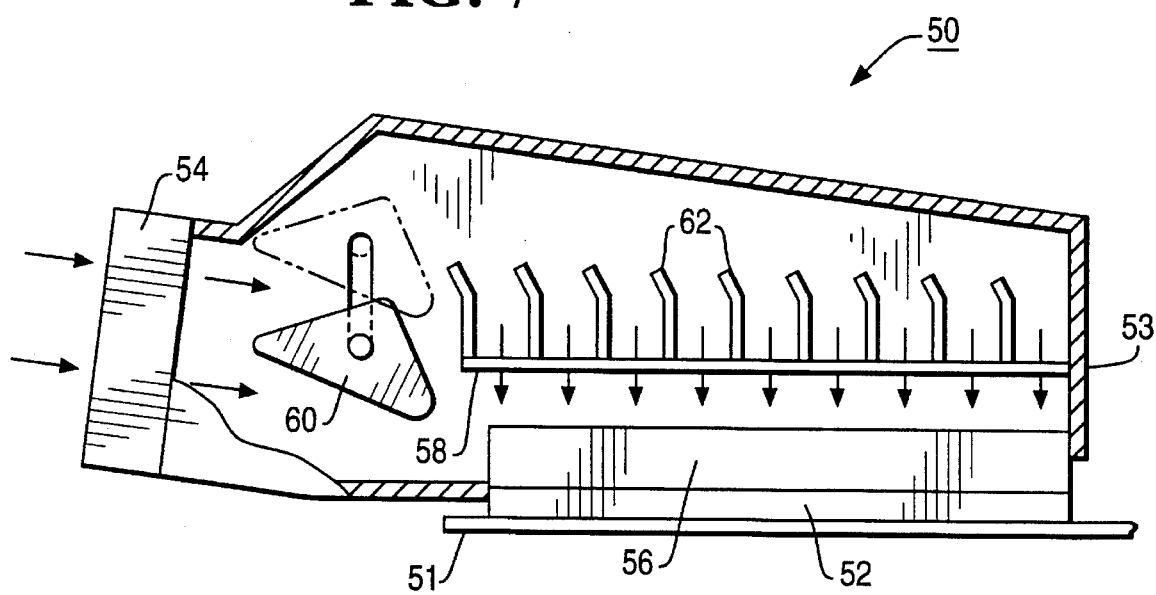
FIG. 7 is a partial cross-sectional view of a second embodiment of a cooling apparatus which incorporates the features of the present invention therein.

Referring now to FIG. 7, there is shown a second embodiment of a cooling apparatus 50. The cooling apparatus 50 is adapted to cool a heat source 52, such as an integrated circuit device which is mounted on a printed circuit board 51.

The cooling apparatus 50 includes housing 53 and a fan 54. The fan 54 is positioned at one end of the housing 53. The cooling apparatus 50 further includes a base 56, a plate 58 and a movable baffle 60. The base 56 is positioned in contact with the heat source 52. The plate 58 is positioned over the base 56. The cooling apparatus 50 further includes a plurality of plate baffles 62 which are secured in contact with the plate 58 as shown in FIG. 7.

The components of cooling apparatus 50 are substantially similar to the components of cooling apparatus 10, and thus will not be further described. Moreover, the operation of cooling apparatus 50 with the movable baffle 60 positioned as shown in solid lines in FIG. 7 is substantial similar to the operation of the cooling apparatus 10, and thus will not be further described.

However, the movable baffle 60 may be relocated from its position as shown in the solid lines in FIG. 7 to its position as shown in the phantom lines in FIG. 7. The movable baffle 60 may also be temporarily secured at any position between the above two extremes, if desired. Note that the magnitude of the flow of fluid which is directed upwardly in the housing 53 for ultimate impingement upon the top surface of the fins of the base 56 may be changed by selective positioning of the movable baffle 60. Further note that the flow of fluid which is directed upwardly for impingement on the fins may be substantially cut off by securing the movable baffle at its upper most position as shown in the phantom lines in FIG. 7.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

What is claimed is:

1. A heat source cooling apparatus, comprising:
    a thermally conductive base having a plurality of channels defined therein, said base adapted to be positioned in contact with a heat source;
    means for generating an initial flow of fluid;
    a baffle positioned in the initial flow of fluid so as to create a first flow of fluid and a second flow of fluid;
    means for directing the first flow of fluid against said base; and
    means for directing the second flow of fluid into the channels,
    wherein said base includes a plurality of fins which define the plurality of channels,
    wherein said first flow directing means is adapted to advance the first flow of fluid against the plurality of fins so as to form a quantity of spent fluid,
    wherein the quantity of spent fluid is advanced into the plurality of channels, and
    wherein said second flow directing means is adapted to force the quantity of spent fluid out of the plurality of channels.

2. The apparatus of claim 1, wherein said baffle is movable between a first position and a second position.

3. The apparatus of claim 2, wherein movement of said baffle between the first position and the second position changes the magnitude of the first flow of fluid.

4. The apparatus of claim 3, wherein movement of said baffle between the first position and the second position changes the magnitude of the second flow of fluid.

5. An integrated circuit device cooling method, comprising the steps of:
    providing a thermally conductive base having a plurality of fins on a first side thereof and a mating surface on a second side thereof, with the plurality of fins defining a plurality of channels;
    positioning the mating surface of the base in contact with an integrated circuit device;
    generating an initial flow of fluid;
    positioning a baffle in the path of the initial flow of fluid so as to create a first flow of fluid and a second flow of fluid;
    directing the first flow of fluid onto a top surface of the plurality of fins so as to form a quantity of spent fluid which continues to be advanced into the plurality of channels; and
    directing the second flow of fluid through the plurality of channels so as to exhaust the quantity of spent fluid from the plurality of channels.

6. The method of claim 5, further comprising the step of:
    repositioning the baffle from a first position to a second position to change the magnitude of the first flow of fluid.

7. The method of claim 6, wherein the repositioning step includes the step of changing the magnitude of the second flow of fluid.

8. A heat source cooling method, comprising the steps of:
    providing a thermally conductive base having a plurality of channels defined therein;
    positioning the base in contact with a heat source;
    generating an initial flow of fluid;
    positioning a baffle in the path of the initial flow of fluid so as to create a first flow of fluid and a second flow of fluid;
    directing the first flow of fluid onto the base; and
    directing the second flow of fluid into the plurality of channels,
    wherein the base includes a plurality of fins which define the plurality of channels,
    wherein the first flow directing step includes the step of advancing the first flow of fluid onto the plurality of fins so as to form a quantity of spent fluid,
    wherein the first flow directing step further includes the step of advancing the quantity of spent fluid into the plurality of channels, and
    wherein the second flow directing step includes the step of forcing the quantity of spent fluid out of the plurality of channels.

9. The method of claim 8, further comprising the step of:
    repositioning the baffle from a first position to a second position to change the magnitude of the first flow of fluid.

10. The method of claim 9, wherein the repositioning step includes the step of changing the magnitude of the second flow of fluid.

11. A heat source cooling method, comprising the steps of:

providing a thermally conductive base having a plurality of channels defined therein;

positioning the base in contact with a heat source;

generating an initial flow of fluid;

positioning a baffle in the path of the initial flow of fluid so as to create a first flow of fluid and a second flow of fluid;

directing the first flow of fluid onto the base; and directing the second flow of fluid into the plurality of channels, wherein the base includes a plurality of fins which define the plurality of channels, wherein the first flow directing step includes the step of advancing the first flow of fluid onto the plurality of fins so as to form a quantity of spent fluid, wherein the first flow directing step further includes the steps of:

providing a plate having a plurality of openings defined therein;

positioning the plate over the base so that each of the plurality of openings is aligned with one of the plurality of fins; and advancing the first flow of fluid through the plurality of openings so that the first flow of fluid impinges onto the plurality of fins.

12. The method of claim 11, further comprising the step of:

repositioning the baffle from a first position to a second position to change the magnitude of the first flow of fluid.

13. The method of claim 12, wherein:

the repositioning step includes the step of changing the magnitude of the second flow of fluid.

* * * * *